United States Patent
Takeda et al.

(10) Patent No.: US 8,022,475 B2
(45) Date of Patent: Sep. 20, 2011

(54) SEMICONDUCTOR DEVICE OPTIMIZED TO INCREASE WITHSTAND VOLTAGE AND REDUCE ON RESISTANCE

(75) Inventors: Yasuhiro Takeda, Gifu (JP); Seiji Otake, Saitama (JP); Kazunori Fujita, Gifu (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 189 days.

(21) Appl. No.: 12/434,128

(22) Filed: May 1, 2009

(65) Prior Publication Data
US 2009/0278200 A1    Nov. 12, 2009

(30) Foreign Application Priority Data
May 8, 2008  (JP) ................................. 2008-121920

(51) Int. Cl.
*H01L 29/76* (2006.01)
*H01L 29/94* (2006.01)
(52) U.S. Cl. .. 257/331; 257/332; 257/401; 257/E27.059
(58) Field of Classification Search .................. 257/331, 257/332, 401, E27.059
See application file for complete search history.

(56) References Cited

U.S. PATENT DOCUMENTS

| | | | | |
|---|---|---|---|---|
| 4,111,720 A | * | 9/1978 | Michel et al. | 438/334 |
| 5,218,224 A | * | 6/1993 | Taguchi | 257/547 |
| 5,290,714 A | * | 3/1994 | Onozawa | 438/207 |
| 5,350,939 A | * | 9/1994 | Honda et al. | 257/378 |
| 5,798,560 A | * | 8/1998 | Ohkawa et al. | 257/555 |
| 6,522,012 B2 | * | 2/2003 | Okawa et al. | 257/773 |
| 7,211,829 B2 | * | 5/2007 | Yasukawa et al. | 257/79 |
| 7,629,214 B2 | * | 12/2009 | Otake et al. | 438/224 |
| 7,829,970 B2 | * | 11/2010 | Girdhar et al. | 257/476 |
| 2002/0053705 A1 | * | 5/2002 | Kondo et al. | 257/368 |
| 2002/0053737 A1 | * | 5/2002 | Kondo et al. | 257/758 |
| 2005/0145905 A1 | * | 7/2005 | Iwata | 257/292 |
| 2006/0223259 A1 | * | 10/2006 | Otake et al. | 438/224 |
| 2008/0296722 A1 | * | 12/2008 | Girdhar et al. | 257/476 |
| 2009/0090981 A1 | * | 4/2009 | Natsuaki | 257/408 |

FOREIGN PATENT DOCUMENTS

| | | |
|---|---|---|
| JP | 2003-303959 | 10/2003 |
| JP | 2003-303960 | 10/2003 |
| JP | 2004-064036 | 2/2004 |
| JP | 2007-201391 | 8/2007 |

* cited by examiner

*Primary Examiner* — Ngan Ngo
(74) *Attorney, Agent, or Firm* — Morrison & Foerster LLP

(57) ABSTRACT

An ON resistance of a trench gate type transistor and a withstand voltage of a planar type transistor are optimized at the same time. Each of first and second regions of a semiconductor layer is formed by epitaxial growth on each of first and second regions of a semiconductor substrate, respectively. A first buried layer is formed between the first region of the semiconductor substrate and the first region of the semiconductor layer, while a second buried layer is formed between the second region of the semiconductor substrate and the second region of the semiconductor layer. The first buried layer is formed of an $N^+$ type first impurity-doped layer and an N type second impurity-doped layer that extends beyond the fist impurity-doped layer. The second buried layer is formed of an $N^+$ type impurity-doped layer only. In the first region of the semiconductor layer, an impurity is diffused from a surface of the semiconductor layer deep into the semiconductor layer to form an N type third impurity-doped layer. The trench gate type transistor is formed in the first region of the semiconductor layer and the planar type transistor is formed in the second region of the semiconductor layer.

9 Claims, 7 Drawing Sheets

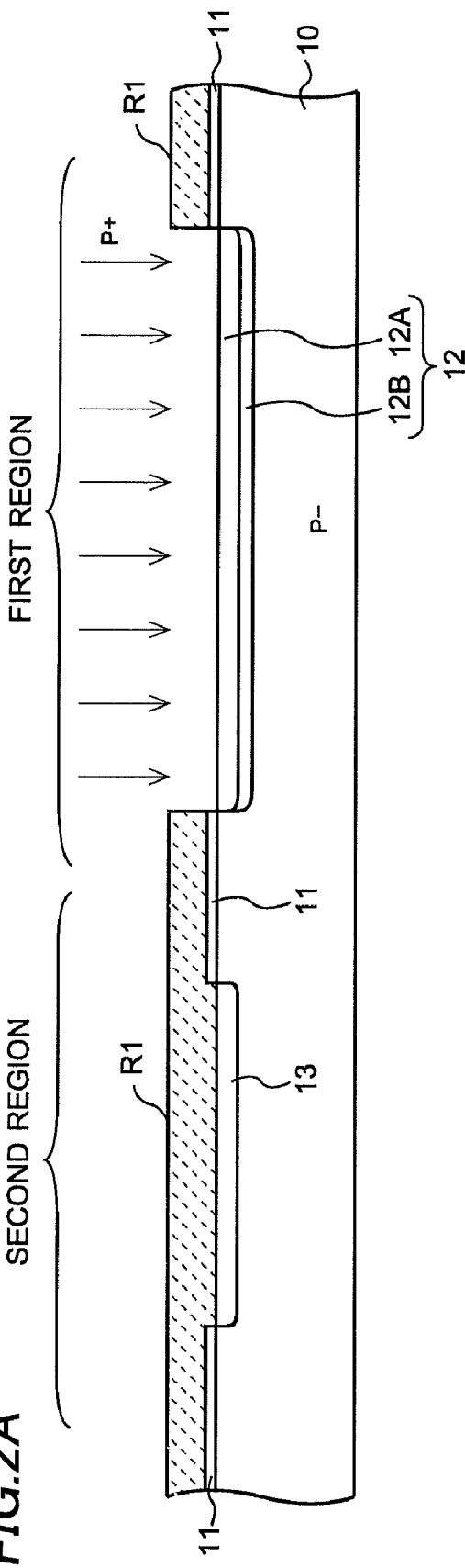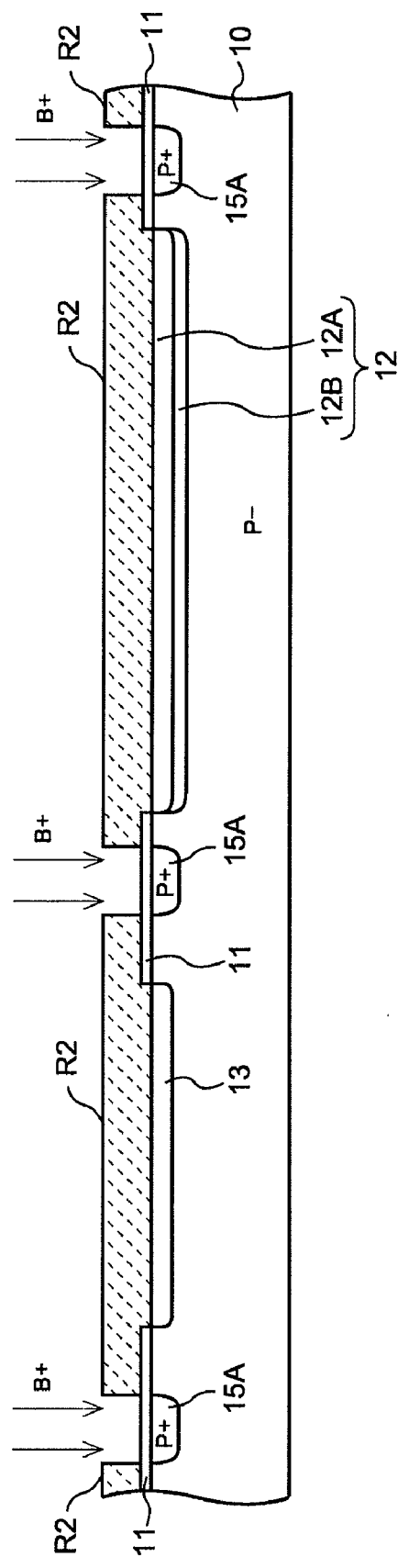

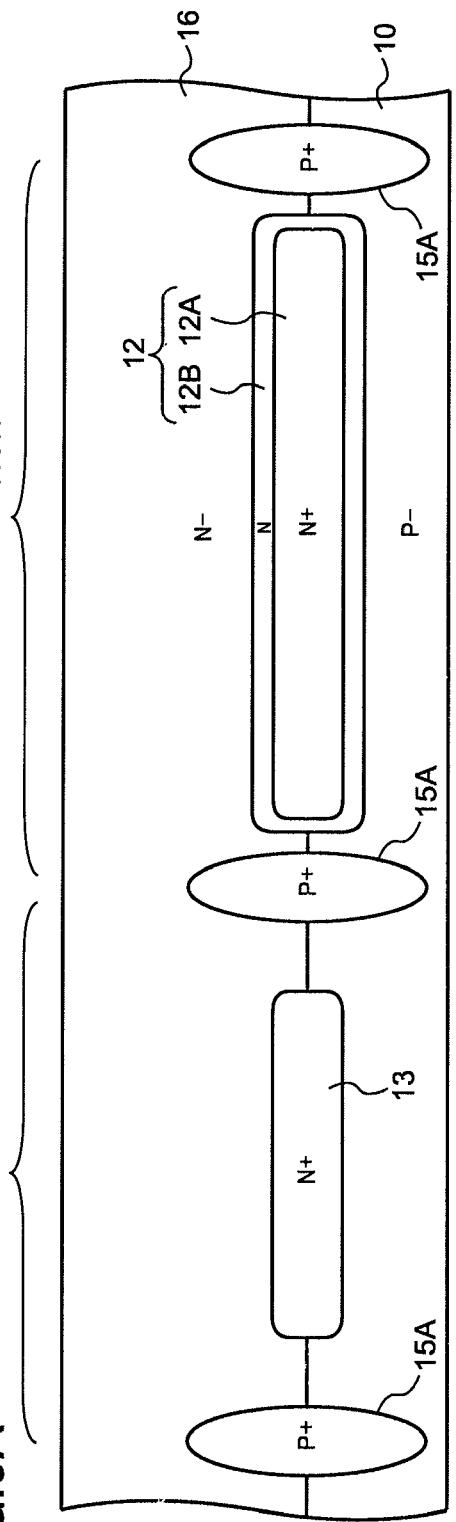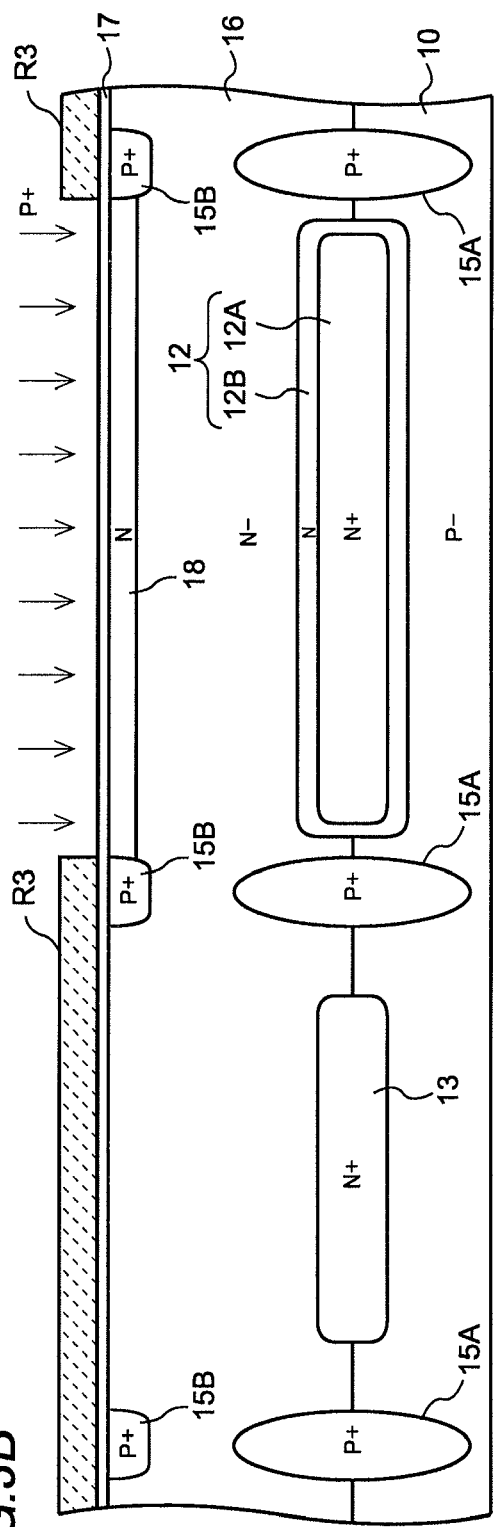

SEMICONDUCTOR DEVICE OPTIMIZED TO INCREASE WITHSTAND VOLTAGE AND REDUCE ON RESISTANCE

CROSS-REFERENCE OF THE INVENTION

This application claims priority from Japanese Patent Application No. 2008-121920, the content of which is incorporated herein by reference in its entirety.

BACKGROUND OF THE INVENTION

1. Field of the Invention

This invention relates to a transistor in which an electric current flows in a direction perpendicular to a surface of a semiconductor substrate, a semiconductor device having a first transistor in which an electric current flows in a direction perpendicular to a surface of a semiconductor substrate and a second transistor in which an electric current flows in a direction parallel to the surface of the semiconductor substrate, and a method of manufacturing the devices.

2. Description of the Related Art

A DMOS transistor is a double-diffused MOS field effect transistor, and is used as a power semiconductor device for a power supply circuit, a driver circuit or the like. A trench gate type transistor (that is, a transistor in which an electric current flows in a direction perpendicular to a surface of a semiconductor substrate) having a gate electrode buried in a trench has been known as a kind of the DMOS transistor.

In recent years, a technology to form the trench gate type transistor and a planar type transistor (that is, a transistor in which an electric current flows in a direction parallel to the surface of the semiconductor substrate) on a common semiconductor substrate has been developed. In this case, a semiconductor layer is formed on the semiconductor substrate by epitaxial growth and divided into a plurality of island regions by device isolation layers. The trench gate type transistor is formed in one of the island regions isolated by the device isolation layers, while the planar type transistor is formed in another of the island regions isolated by the device isolation layers.

The trench gate type transistor is required to reduce its ON resistance (a resistance of the transistor when it is turned on) and its parasitic capacitance at a junction in it.

Also, when the trench gate type transistor and the planar type transistor are formed on the common semiconductor substrate, there is a requirement that the ON resistance of the trench gate type transistor and a withstand voltage of the planar type transistor are optimized at the same time.

With conventional technologies, however, optimizing both the characteristics that are the ON resistance and the withstand voltage has been difficult. For example, when an impurity concentration in the semiconductor layer is set to be low in order to secure the withstand voltage of the planar type transistor, the ON resistance of the trench gate type transistor is increased. On the other hand, when the impurity concentration in the semiconductor layer is set to be high in order to reduce the ON resistance of the trench gate type transistor, the withstand voltage of the planar type transistor is reduced.

SUMMARY OF THE INVENTION

The invention provides a transistor that includes a semiconductor substrate, a semiconductor layer formed on the semiconductor substrate, and a buried layer formed between the semiconductor substrate and the semiconductor layer. The transistor is configured to allow an electric current to flow through the transistor in a direction of stacking of a stack of the semiconductor substrate, the buried layer and the semiconductor layer. The buried layer includes a first impurity-doped layer having a first peak impurity concentration of a first impurity and a second impurity-doped layer having a second peak impurity concentration of a second impurity. The second peak impurity is lower than the first peak impurity, and the second impurity-doped layer extends further into the semiconductor layer than the first impurity-doped layer.

The invention also provides a semiconductor device that includes a semiconductor substrate, a semiconductor layer formed on the semiconductor substrate and including a first region and a second region, a device isolation layer isolating the first region from the second region, a first transistor formed in the first region so as to allow an electric current to flow through the first transistor in a direction of stacking of a stack of the semiconductor substrate and the semiconductor layer, and a second transistor formed in the second region so as to allow an electric current to flow through the second transistor in a direction along a surface of the semiconductor layer. The impurity concentration in the first region of the semiconductor layer is different from the impurity concentration in the second region of the semiconductor layer.

The invention further provides a method of manufacturing a semiconductor device. The method includes providing a semiconductor substrate including a first region and a second region, introducing a first impurity into the first region and the second region, and introducing a second impurity only into the first region. The second impurity has a higher diffusion coefficient than the first impurity. The method also includes forming a semiconductor layer on the semiconductor substrate by epitaxial growth so that a first buried layer is formed in the first region by diffusion of the first impurity and the second impurity and a second buried layer is formed in the second region by diffusion of the first impurity, forming a first transistor in the semiconductor layer in the first region so as to allow an electric current to flow through the first transistor in a direction of stacking of a stack of the semiconductor layer and the semiconductor substrate, and forming a second transistor in the semiconductor layer in the second region so as to allow an electric current to flow through the second transistor in a direction along the surface of the semiconductor layer.

BRIEF DESCRIPTION OF THE DRAWINGS

FIGS. 2A and 2B are cross-sectional views showing the semiconductor device and its manufacturing method according to the first embodiment of this invention.

FIGS. 3A and 3B are cross-sectional views showing the semiconductor device and its manufacturing method according to the first embodiment of this invention.

DETAILED DESCRIPTION OF THE INVENTION

Figure 1A:
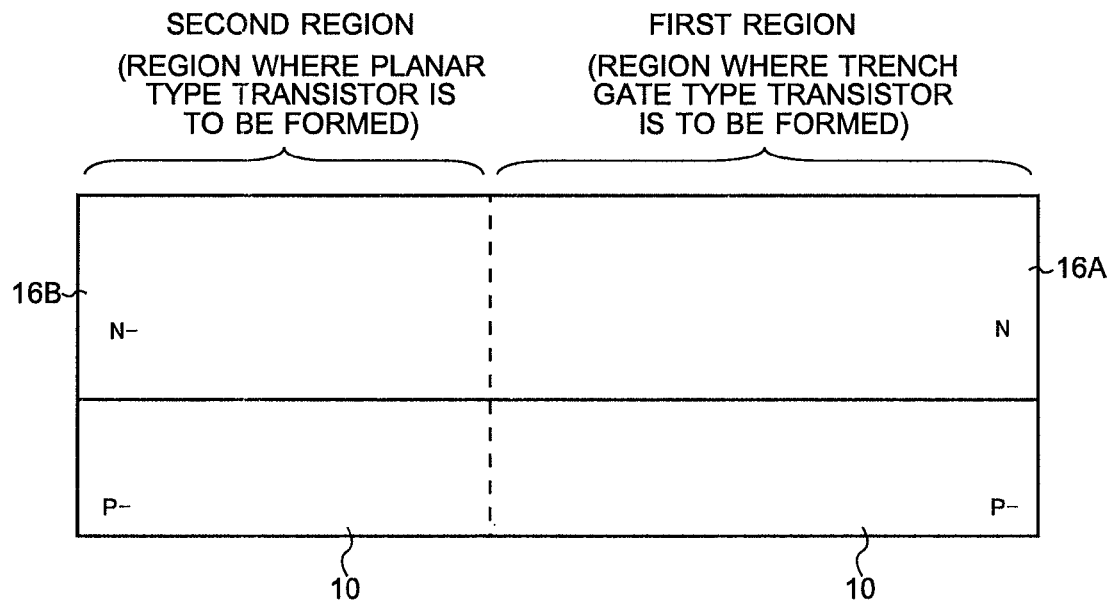
FIGS. 1A and 1B are conceptual diagrams showing a cross-sectional structure of a semiconductor device according to a first embodiment of this invention.

A semiconductor device according to a first embodiment of this invention will be described. A basic structure of the semiconductor device is described first, and then its detailed structure will be described. A first region in which a trench gate type transistor (not shown) is to be formed and a second region in which a planar type transistor (not shown) is to be formed are provided next to each other in a P⁻ type semiconductor substrate 10, as shown in FIG. 1A. An N type semiconductor layer 16A is formed on the semiconductor substrate 10 in the first region, while an N⁻ type semiconductor layer 16B is formed on the semiconductor substrate 10 in the second region. The semiconductor layer 16A in the first region makes a drain layer of the trench gate type transistor.

An impurity concentration in the semiconductor layer 16A in the first region is set to be higher than an impurity concentration in the semiconductor layer 16B in the second region. An ON resistance of the trench gate type transistor to be formed in the first region and a withstand voltage of the planar type transistor to be formed in the second region can be optimized at the same time by setting the impurity concentrations as described above. That is, the ON resistance (that is, a drain resistance) of the trench gate type transistor can be reduced by increasing the impurity concentration in the semiconductor layer 16A in the first region, while the withstand voltage (a withstand voltage of a PN junction formed in the semiconductor layer 16B, for example) of the planar type transistor can be increased by reducing the impurity concentration in the semiconductor layer 16B in the second region.

Figure 1B:
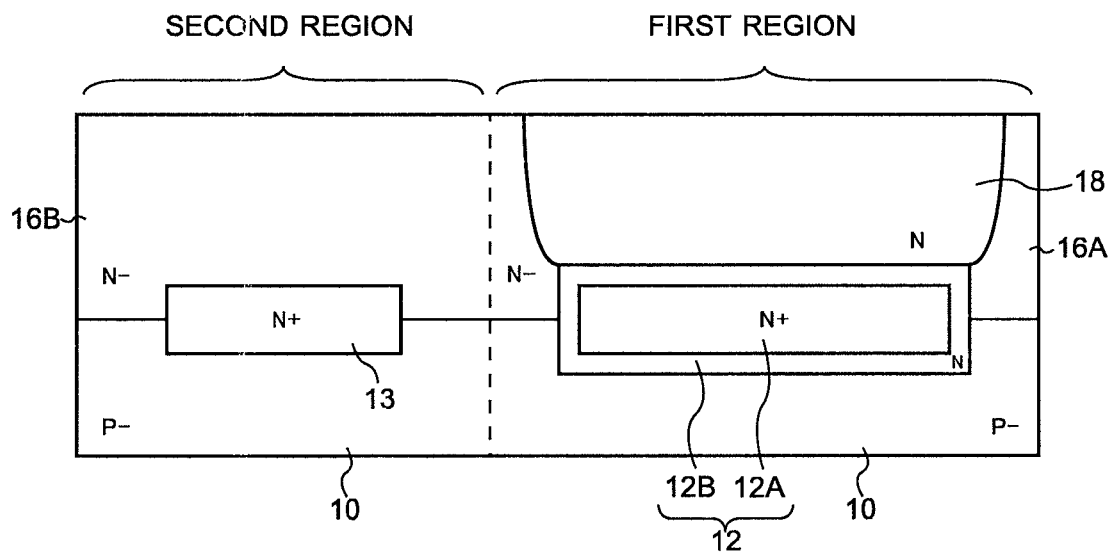

However, because the semiconductor layers 16A and 16B are formed simultaneously by epitaxial growth, it is difficult to make the impurity concentrations different from each other. Thus, the impurity concentrations as described above can be implemented practically by the following technology. The semiconductor layers 16A and 16B are initially formed as epitaxial layers having the same impurity concentration to each other, as shown in FIG. 1B. And a first buried layer 12 is formed in the first region while a second buried layer 13 is formed in the second region.

The first buried layer 12 is formed of an N⁺ type first impurity-doped layer 12A and an N type second impurity-doped layer 12B, which extends beyond the fist impurity-doped layer 12A. On the other hand, the second buried layer 13 is formed of a single N⁺ type impurity-doped layer. It is preferable that an N type third impurity-doped layer 18 is formed in the first region by diffusing impurities from its surface deep into the semiconductor layer 16A so as to make the impurity concentration distribution more uniform.

Next, the detailed structure of the semiconductor device according to the first embodiment of this invention will be described referring to the figures. First, as shown in FIG. 2A, a silicon oxide film 11 is formed by thermal oxidation on a surface of the P⁻ type semiconductor substrate 10, which is doped with P type impurities such as boron (B).

Next, a resist layer (not shown) is formed on the silicon oxide film 11. The resist layer has openings in regions where the first buried layer 12 and the second buried layer 13 are to be formed. The silicon oxide film 11 is selectively etched off using the resist layer as a mask, and the resist layer is removed thereafter. Then, a diffusion source including N type first impurities such as antimony (Sb) is deposited by a coating method or the like, and a thermal treatment is performed.

With this, the N⁺ type first impurity-doped layer 12A that makes a part of the first buried layer 12 is formed in the first region, while the N⁺ type second buried layer 13 is formed in the second region.

Next, a resist layer R1 is formed on the silicon oxide film 11. The resist layer R1 has an opening in the region corresponding to the first buried layer 12 in the first region. N type second impurities such as phosphorus (P), which has higher diffusion coefficient than the first impurities, are ion-implanted using the resist layer R1 as a mask. As a result, an N type second impurity-doped layer 12B overlapping with and extending deeper than the fist impurity-doped layer 12A is formed as a part of the first buried layer 12 in the first region. The resist layer R1 is removed after the ion-implantation.

Next, a resist layer R2 is formed on the silicon oxide film 11, as shown in FIG. 2B. The resist layer R2 has openings on borders between the first region and the second region, that is, in regions where first device isolation layers 15A are to be formed. Then, the first device isolation layers 15A are formed by ion-implanting P type impurities such as boron (B) into the semiconductor substrate 10 using the resist layer R2 as a mask. The resist layer R2 and the silicon oxide film 11 are removed after the ion-implantation.

Next, an N⁻ type semiconductor layer 16 is formed by epitaxial growth on the surface of the semiconductor substrate 10 including the first buried layer 12, the second buried layer 13 and the first device isolation layers 15A, as shown in FIG. 3A. At that time, the impurities in the first buried layer 12 and the second buried layer 13 are diffused into the semiconductor layer 16 as well as being diffused into the semiconductor substrate 10. Also at the same time, the impurities in the first device isolation layers 15A are diffused into the semiconductor layer 16 as well as being diffused into the semiconductor substrate 10.

To describe more in detail, the first impurity-doped layer 12A in the first buried layer 12 has a first peak impurity concentration, and the second impurity-doped layer 12B has a second peak impurity concentration that is lower than the first peak impurity concentration. The impurities in the second impurity-doped layer 12B are diffused farther into the semiconductor layer 16 as well as farther into the semiconductor substrate 10 than the impurities in the first impurity-doped layer 12A. It is noted that the peak impurity concentration means a peak value of an impurity concentration distribution along a direction perpendicular to the surface of the semiconductor substrate 10.

Next, a silicon oxide film 17 is formed by thermal oxidation on the surface of the semiconductor layer 16, as shown in FIG. 3B. Next, a resist layer (not shown) is formed on the silicon oxide film 17. The resist layer has openings in regions where second device isolation layers 15B are to be formed. Then, the P⁺ type second device isolation layers 15B are formed by ion-implanting P type impurities such as boron (B) into the semiconductor substrate 16 using the resist layer as a mask. The resist layer is removed after the ion-implantation.

After that, a resist layer R3 is formed on the silicon oxide film 17. The resist layer R3 has an opening in a region in the first region where a third impurity-doped layer 18 is to be formed. The N type third impurity-doped layer 18 is formed by ion-implanting N type third impurities such as phosphorus (P) into the semiconductor layer 16 using the resist layer R3 as a mask so that the third impurities reach partway through a thickness of the semiconductor layer 16. The resist layer R3 is removed after the ion-implantation.

Figure 4:
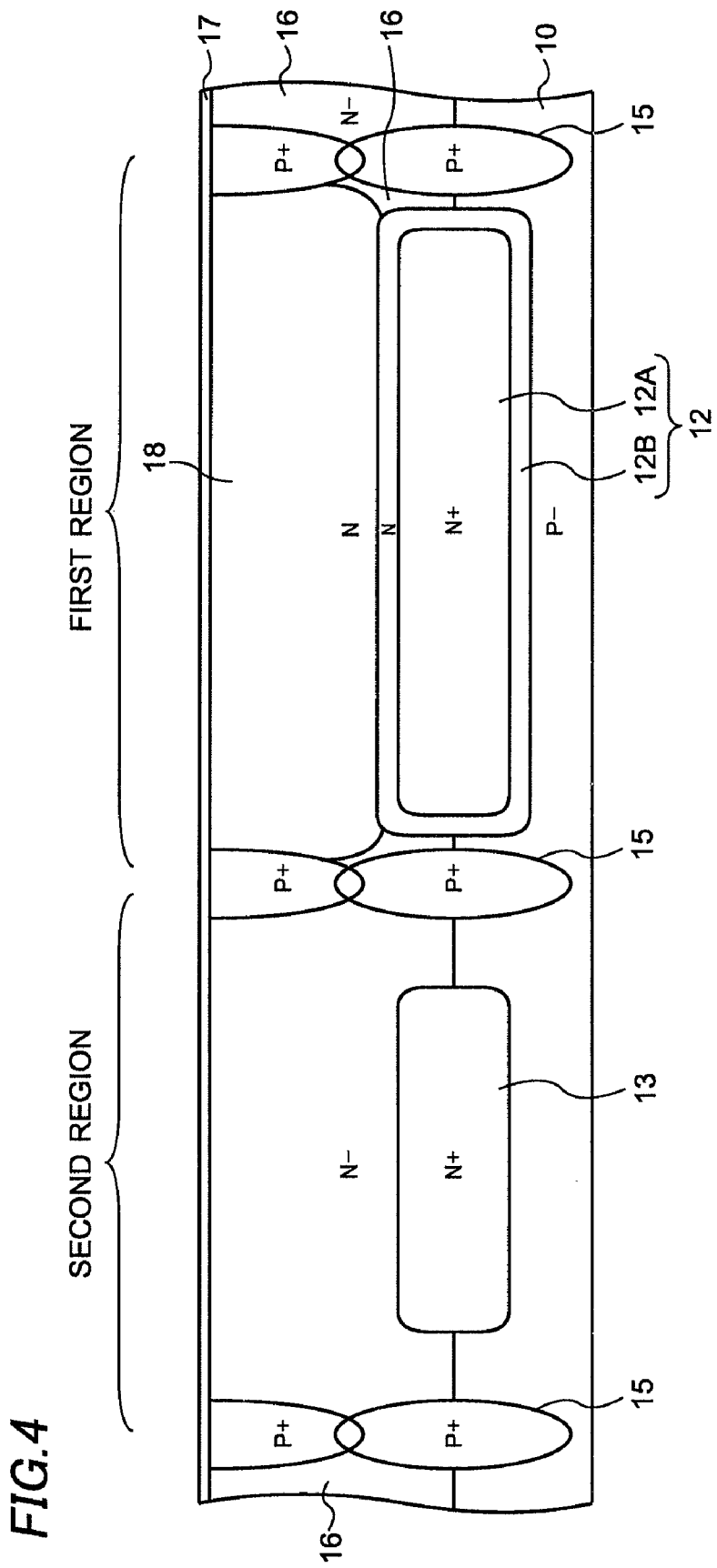
FIG. 4 is a cross-sectional view showing the semiconductor device and its manufacturing method according to the first embodiment of this invention.

Next, the third impurities in the N type third impurity-doped layer 18 are thermally diffused until they reach the second impurity-doped layer 12B, as shown in FIG. 4. As a result, the impurities are distributed more uniformly over the semiconductor layer 16 in the first region and an average impurity concentration in the semiconductor layer 16 in the first region is made higher than an average impurity concentration in the semiconductor layer 16 in the second region. The impurities in the second device isolation layers 15B are also diffused during the thermal diffusion so that the first device isolation layer 15A and the second device isolation layer 15B make contact with each other to form a device isolation layer 15. As described above, the impurity concentration in the semiconductor layer 16A in the first region is made higher than the impurity concentration in the semiconductor layer 16B in the second region, as in the structure shown in FIG. 1B.

Figure 5:
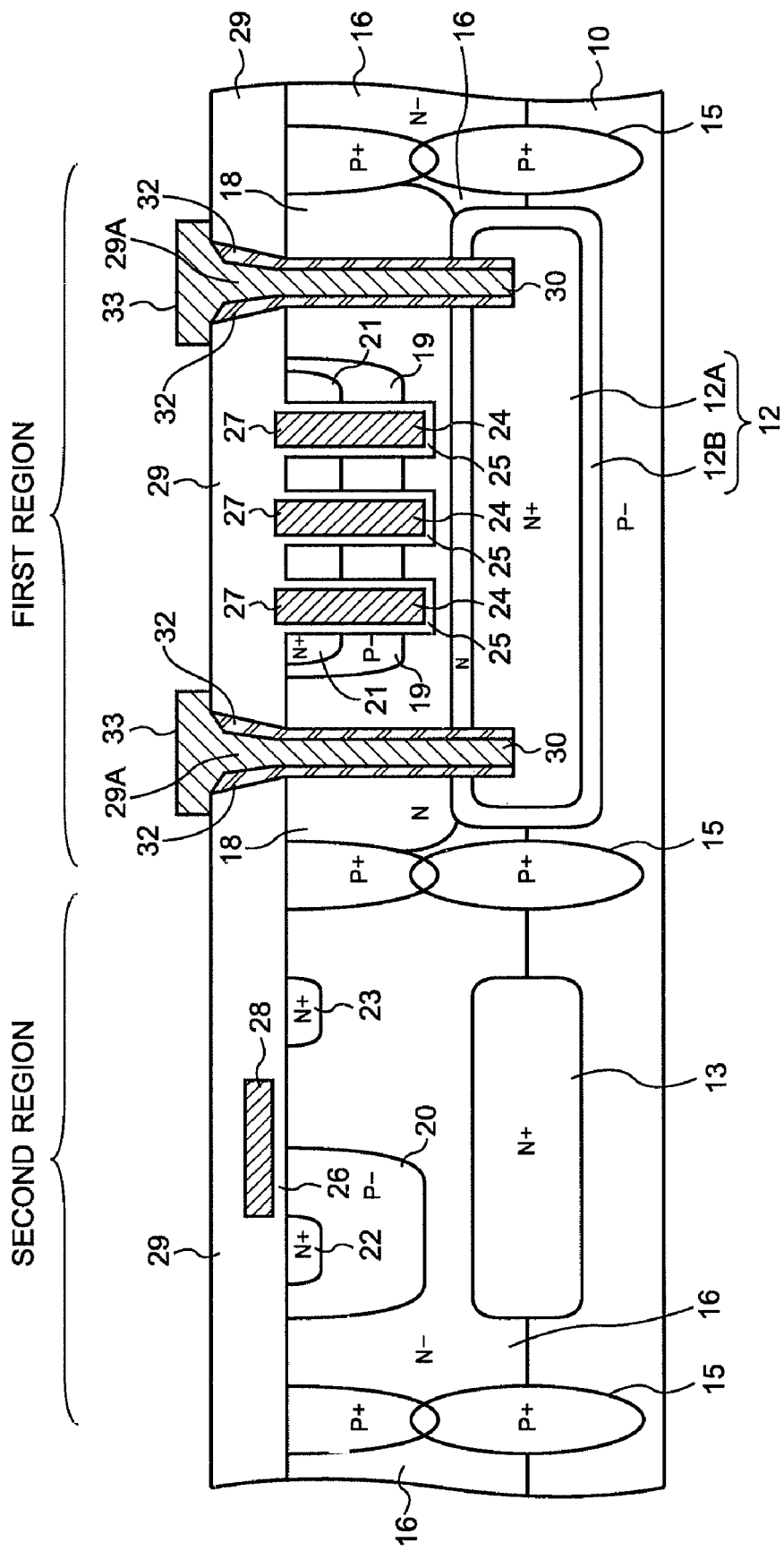
FIG. 5 is a cross-sectional view showing the semiconductor device and its manufacturing method according to the first embodiment of this invention.

Next, the trench gate type transistor is formed in the first region while the planar type transistor is formed in the second region, as shown in FIG. 5. A method of forming the trench gate type transistor and the planar type transistor is explained hereafter. In the explanation described below, the planar type transistor is exemplified by a planar type DMOS transistor.

First, a resist layer (not shown) is formed to cover the semiconductor layer 16. The resist layer has openings in a region where a first P$^-$ type body layer 19 for the trench gate type transistor is to be formed and in a region where a second P$^-$ type body layer 20 for the planar type transistor is to be formed. P type impurities such as boron (B) are ion-implanted and diffused using the resist layer as a mask. As a result, the first body layer 19 is formed in the first region, while the second body layer 20 is formed in the second region. The resist layer is removed after the ion-implantation.

Next, first trenches 24 which extend partway through a thickness of the third impurity-doped layer 18 is formed from a surface of the first body layer 19. A first gate insulation film 25 made of a silicon oxide film or the like is formed by thermal oxidation to cover a surface of the third impurity-doped layer 18 including inside of the first trenches 24 and a surface of the first body layer 19 in the first region. A second gate insulation film 26 that is made of a silicon oxide film and covers a surface of the second body layer 20 can be formed in the second region at the same time.

After that, first gate electrodes 27 made of polysilicon, for example, are formed in the first trenches 24 covered with the first gate insulation film 25 in the first region. That is, the first trench 24 is a trench for a gate of the trench gate type transistor formed in the first region, and the first gate electrode 27 is a trench gate. In the second region, a second gate electrode 28 that is to make a gate of the planar type transistor to be formed in the second region is formed on the second gate insulation film 26.

Next, a resist layer (not shown) is formed to cover the semiconductor layer 16. The resist layer has openings in a region where an N$^+$ type first source layer 21 of the trench gate type transistor is to be formed and in regions where an N$^+$ type second source layer 22 and an N$^+$ type drain layer 23 of the planar type transistor are to be formed.

The N$^+$ type first source layer 21 is formed in the first region by ion-implanting N type impurities such as arsenic (As) using the resist layer as a mask. As a result, a double diffused structure of the first body layer 19 and the first source layer 21 is formed in the first region.

At the same time, the N$^+$ type second source layer 22 and the N$^+$ type drain layer 23 are formed in the second region by ion-implanting the N type impurities mentioned above using the resist layer as a mask. The resist layer is removed after the ion-implantation.

Next, an interlayer insulation film 29 made of a silicon oxide film formed by a CVD (Chemical Vapor Deposition) method, for example, is formed to cover the semiconductor layer 16, the third impurity-doped layer 18, the first body layer 19, the second body layer 20, the first source layer 21, the second source layer 22 and the drain layer 23. Note that the silicon oxide film 17 which has been formed in the preceding process step is shown as part of the interlayer insulation film 29 in the drawing.

Next, second trenches 30 that extend from a surface of the third impurity-doped layer 18 to the first buried layer 12 (the first impurity-doped layer 12A, for example) are formed in the first region by selectively etching the interlayer insulation film 29 to form openings 29A and further etching the third impurity-doped layer 18 and the first buried layer 12. The second trenches 30 serve to make the drain connected to the surface.

Next, a spacer insulation film 32 made of a silicon oxide film, for example, is formed on the interlayer insulation film 29 and in the second trenches 30 by the CVD method, for example. After that, the spacer insulation film 32 on the interlayer insulation film 29 and the spacer insulation film 32 at a bottom of each of the second trenches 30 are removed by etching without using a mask. As a result, the spacer insulation film 32 is left on a sidewall of each of the second trenches 30, while the first buried layer 12 (the first impurity-doped layer 12A, for example) is exposed at the bottom of each of the second trenches 30.

Next, there are formed drain electrodes 33 that are connected with the exposed first buried layer 12 (the first impurity-doped layer 12A, for example) through the second trenches 30 and extend over the interlayer insulation film 29. The drain electrodes 33 are made of material including tungsten, for example, and formed by the CVD method, for example.

The trench gate type transistor is formed in the first region and the planar type transistor is formed in the second region as described above. To describe an operation of the trench gate type transistor, when a voltage above a threshold value is applied to the first gate electrode 27, a channel region in the first body layer 19 is inverted to N type to form an electric current path running from the drain electrode 33 to the first source layer 21 through the first buried layer 12, the third impurity-doped layer 18 and the channel region in the semiconductor layer 16 in the first region. Since the impurity concentration in the semiconductor layer 16 in the first region is high, the ON resistance (that is, the drain resistance) of the trench gate type transistor can be reduced.

In the planar type transistor, on the other hand, when a voltage above a threshold value is applied to the second gate electrode 28, a channel region in the second body layer 20 is inverted to N type to form an electric current path running from the drain layer 23 to the second source layer 22 through the channel region. If the semiconductor layer 16 in the second region had the same impurity concentration as the impurity concentration in the third impurity-doped layer 18 in the first region, there would be a problem in a withstand voltage of a PN junction formed between the second body layer 20 and the semiconductor layer 16 in the second region. However, the withstand voltage of the PN junction in the planar type transistor according to the first embodiment of this invention can be increased, since the impurity concentration in the semiconductor layer 16 in the second region is lower than the impurity concentration in the third impurity-doped layer 18. As described above, it is made possible that the ON resistance of the trench gate type transistor is reduced while the withstand voltage of the planar type transistor is increased.

In addition, the trench gate type transistor described above is effective in reducing a drain parasitic capacitance (that is, a capacitance of a junction formed between the first buried layer 12 and the semiconductor substrate 10), since the first buried layer 12 is formed of the N$^+$ type first impurity-doped layer 12A and the N type second impurity-doped layer 12B that extends upward as well as downward farther beyond the $N^+$ type fist impurity-doped layer 12A.

Figure 6:
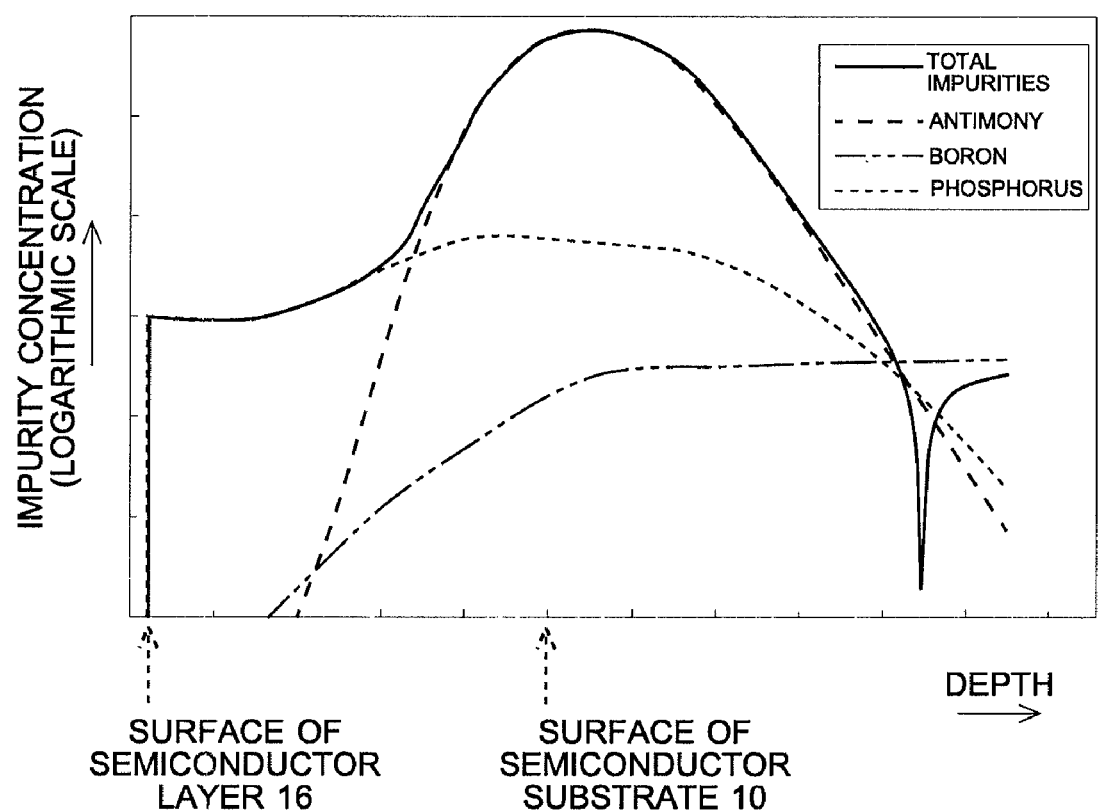
FIG. 6 is a graph showing distribution of impurities in the semiconductor device according to the first embodiment of this invention.

An example of impurity concentration profile in the first region is shown in FIG. 6. A vertical axis of FIG. 6 denotes the impurity concentration in logarithmic scale, while its horizontal axis denotes a depth with reference to the surface of the semiconductor substrate 10. Each of four curves in the figure represents each of the impurity concentrations of antimony (Sb), phosphorus (P), boron (B) and total impurities, respectively.

As understood from the impurity concentration profile, the peak impurity concentration of phosphorus (P) in the second impurity-doped layer 12B is lower than the peak impurity concentration of antimony (Sb) in the first impurity-doped layer 12A. And the phosphorus (P) in the second impurity-doped layer 12B partially overlaps the antimony (Sb) in the first impurity-doped layer 12A and diffuses farther than the antimony (Sb).

The impurity concentration in the semiconductor layer 16 in the first region can be made higher and more uniform over a wide range to form the third impurity-doped layer 18 by diffusing the phosphorus in the second impurity-doped layer 12B so as to spread out from the border between the semiconductor substrate 10 and the semiconductor layer 16 and diffusing phosphorus from the surface of the semiconductor layer 16.

Preventing outer diffusion of phosphorus (P) is important to secure repeatability of implementing the impurity profile as described above. For that purpose, it is preferable to implant phosphorus ions deeper by increasing an acceleration energy at the ion implantation of phosphorus to form the third impurity-doped layer 18.

Figure 7:
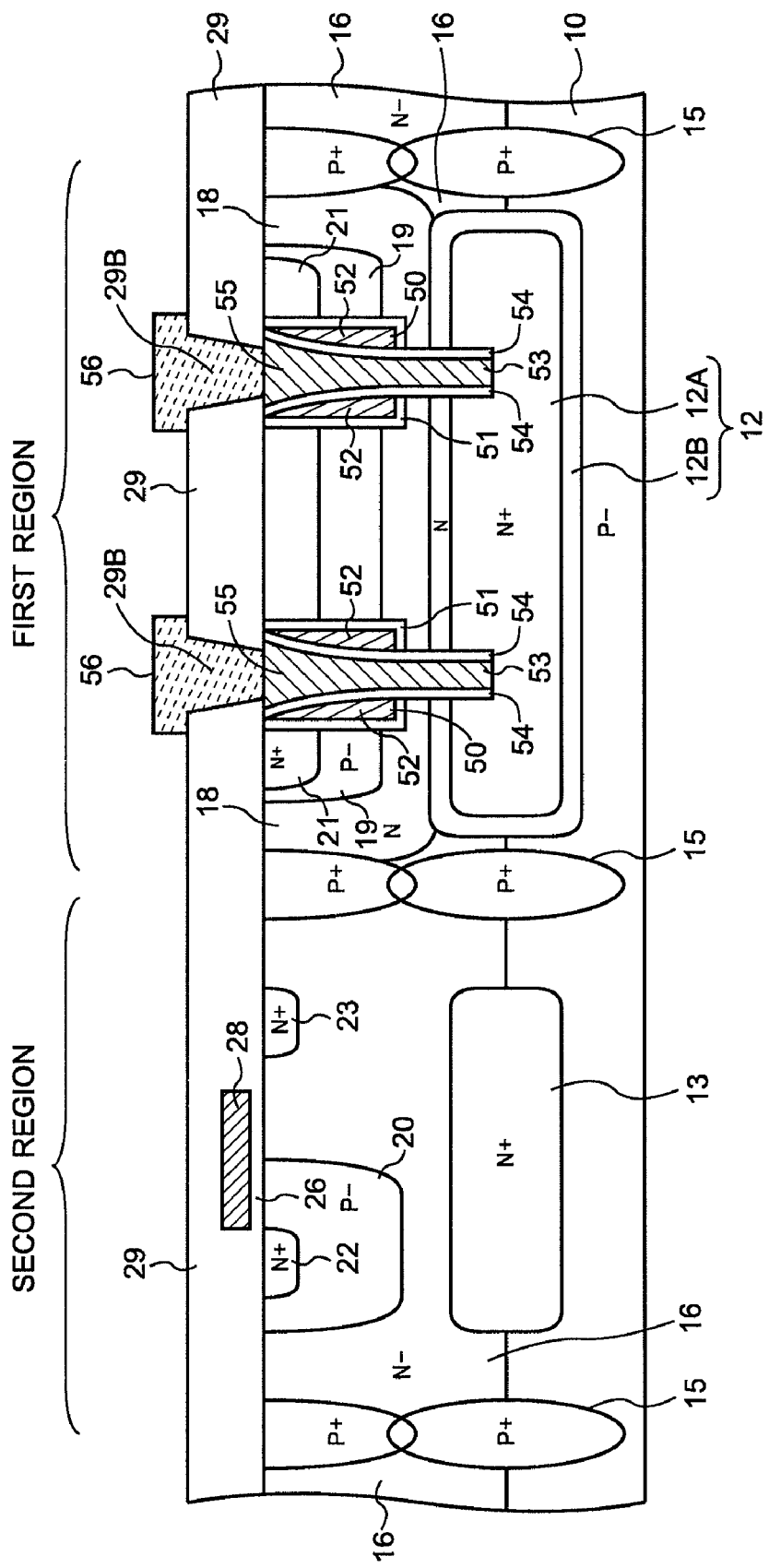
FIG. 7 is a cross-sectional view showing a semiconductor device and its manufacturing method according to a second embodiment of this invention.

A semiconductor device according to a second embodiment of this invention differs from the semiconductor device according to the first embodiment only in a structure of a trench gate type transistor which is shown in FIG. 7. A method of manufacturing the trench gate type transistor is described below. In a process step prior to forming the first source layer 21, third trenches 50 extending partway through the thickness of the third impurity-doped layer 18 are formed from the surface of the first body layer 19 in the first region. A third gate insulation film 51 made of a silicon oxide film is formed by thermal oxidation on a surface of the third impurity-doped layer 18 and a surface of the first body layer 19 including inside of the third trenches 50.

Next, a third gate electrode 52 made of a conductive material such as polysilicon is buried into each of the third trenches 50 covered with the third gate insulation film 51. After that, the first source layer 21 is formed. Next, there are formed fourth trenches 53 each extending from a surface of the third gate electrode 52 to the first buried layer 12 (the first impurity-doped layer 12A, for example). A silicon oxide film 54 is formed in the fourth trenches 53 to cover inner walls of the fourth trenches 53. Then the silicon oxide film 54 at the bottom of each of the fourth trenches 53 is etched off to expose the first buried layer 12 (the first impurity-doped layer 12A, for example), and drain electrodes 55 connected with the exposed first buried layer 12 (the first impurity-doped layer 12A, for example) are formed. An interlayer insulation film 29 is formed, and there are formed electrodes 56 each connected with each of the drain electrodes 55 through each of openings 29B formed in the interlayer insulation film 29, respectively.

The manufacturing process can be simplified because both the third gate electrode 52 and the drain electrode 55 can be formed in a common trench, that is, in the third trench 50, and because the third gate electrode 52 can be formed self-aligned. Also, the drain current can be obtained evenly and effectively from each of the drain electrodes 55, since distances between the sources and the drains in the trench gate type transistor according to the second embodiment of this invention are made shorter and more uniform compared with those of the trench gate type transistor according to the first embodiment of this invention.

With the semiconductor device according to the second embodiment of this invention, it is made possible that the ON resistance of the trench gate type transistor can be reduced by increasing the impurity concentration in the semiconductor layer 16 in the first region, and that the withstand voltage of the planar type transistor is increased by reducing the impurity concentration in the semiconductor layer 16 in the second region.

It is apparent that this invention is not limited to the embodiment described above and may be modified within the scope of the invention.

For example, this invention may be applied to a case in which the first gate insulation film 25 and the second gate insulation film 26 are separately formed and the first body layer 19 and the second body layer 20 are separately formed.

In this case, the withstand voltage of the planar type transistor can be further increased compared with that of the planar type transistor according to the embodiments described above by forming the second gate insulation film 26 thicker than the first gate insulation film 25 and by forming the second body layer 20 thinner than the first body layer 19.

Also, this invention may be applied to a case in which each of the conductivity types of the semiconductor substrate 10, the first buried layer 12, the semiconductor layer 16, the third impurity-doped layer 18, the first body layer 19, the second body layer 20, the first source layer 21, the second source layer 22 and the drain layer 23 in the embodiments described above is modified to an opposite conductivity type, respectively. Also, this invention may be applied to other devices such as a trench gate type IGBT (Insulated Gate Bipolar Transistor).

Also, this invention may be applied to a case in which only the trench gate type transistor in the first region is formed without forming the planar type transistor in the second region. In this case, the structure and the impurity concentration profile in each of the layers on the semiconductor substrate 10 in the first region are the same as those described above.

With the transistors according to the embodiments of this invention, the ON resistance can be reduced while the parasitic capacitance caused between the buried layer and the semiconductor substrate is reduced.

Also, with the semiconductor device and its manufacturing method according to the embodiments of this invention, the ON resistance of the first transistor in which the electric current flows in the direction perpendicular to the surface of the semiconductor substrate and the withstand voltage of the second transistor in which the electric current flows in the direction parallel to the surface of the semiconductor substrate can be optimized at the same time.

It should be noted that the direction perpendicular to the surface of the semiconductor substrate means a direction of stacking of a stack of the semiconductor substrate, the buried layer and the semiconductor layer and does not necessarily mean the direction perpendicular to the surface of the semiconductor substrate, and that the direction parallel to the surface of the semiconductor substrate means a direction along the surface of the semiconductor layer and does not necessarily mean the direction parallel to the surface of the semiconductor substrate.

What is claimed is:

1. A transistor comprising:
   a semiconductor substrate;
   a semiconductor layer formed on the semiconductor substrate; and
   a buried layer formed between the semiconductor substrate and the semiconductor layer,
   wherein the transistor is configured to allow an electric current to flow through the transistor in a direction of stacking of a stack of the semiconductor substrate, the buried layer and the semiconductor layer,
   the buried layer comprises a first impurity-doped layer having a first peak impurity concentration of a first impurity and a second impurity-doped layer having a second peak impurity concentration of a second impurity,
   the second peak impurity concentration is lower than the first peak impurity concentration, and
   the second impurity-doped layer overlaps the first impurity-doped layer, extends further into the semiconductor layer than the first impurity-doped layer and extends further into the semiconductor substrate than the first impurity-doped layer.

2. The transistor of claim 1, further comprising a trench formed in the semiconductor layer and a drain electrode electrically connected to the buried layer through the trench.

3. The transistor of claim 1, wherein a diffusion coefficient of the second impurity is higher than a diffusion coefficient of the first impurity.

4. The transistor of claim 2, wherein a diffusion coefficient of the second impurity is higher than a diffusion coefficient of the first impurity.

5. A semiconductor device comprising:
   a semiconductor substrate;
   a semiconductor layer formed on the semiconductor substrate and comprising a first region and a second region;
   a device isolation layer isolating the first region from the second region;
   a first transistor formed in the first region so as to allow an electric current to flow through the first transistor in a direction of stacking of a stack of the semiconductor substrate and the semiconductor layer; and
   a second transistor formed in the second region so as to allow an electric current to flow through the second transistor in a direction along a surface of the semiconductor layer,
   wherein an average impurity concentration in the first region of the semiconductor layer of a first conductivity type is different from an average impurity concentration in the second region of the semiconductor layer of the first conductivity type.

6. The semiconductor device of claim 5, wherein the impurity concentration in the first region of the semiconductor layer is higher than the impurity concentration in the second region of the semiconductor layer.

7. The semiconductor device of claim 6, further comprising a first buried layer formed between the semiconductor substrate and the first region of the semiconductor layer, and a second buried layer formed between the semiconductor substrate and the second region of the semiconductor layer, wherein the first buried layer comprises a first impurity-doped layer having a first peak impurity concentration of a first impurity and a second impurity-doped layer having a second peak impurity concentration of a second impurity, the second peak impurity concentration is lower than the first peak impurity concentration, the second impurity-doped layer overlaps the first impurity-doped layer, extends further into the semiconductor layer than the first impurity-doped layer and extends further into the semiconductor substrate than the first impurity-doped layer, and the second buried layer comprises an impurity-doped layer comprising the first impurity.

8. The semiconductor device of claim 5, wherein the device isolation layer extends to the semiconductor substrate.

9. A transistor comprising:
   a semiconductor substrate;
   a semiconductor layer formed on the semiconductor substrate;
   a buried layer formed between the semiconductor substrate and the semiconductor layer;
   a trench formed in the semiconductor layer; and
   a drain electrode electrically connected to the buried layer through the trench,
   wherein the transistor is configured to allow an electric current to flow through the transistor in a direction of stacking of a stack of the semiconductor substrate, the buried layer and the semiconductor layer,
   the buried layer comprises a first impurity-doped layer having a first peak impurity concentration of a first impurity and a second impurity-doped layer having a second peak impurity concentration of a second impurity,
   the second peak impurity concentration is lower than the first peak impurity concentration, and
   the second impurity-doped layer extends further into the semiconductor layer than the first impurity-doped layer.

* * * * *